US007619310B2

(12) United States Patent
Huebinger et al.

(10) Patent No.: US 7,619,310 B2
(45) Date of Patent: Nov. 17, 2009

(54) SEMICONDUCTOR INTERCONNECT AND METHOD OF MAKING SAME (75) Inventors: Frank Huebinger, Poughkeepsie, NY (US); Moosung Chae, Poughkeepsie, NY (US); Armin Tilke, Dresden (DE); Hermann Wendt, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 438 days.

(21) Appl. No.: 11/592,427

(22) Filed: Nov. 3, 2006

(65) Prior Publication Data

US 2008/0108219 A1    May 8, 2008

(51) Int. Cl.
*H01L 23/48* (2006.01)
*H01L 21/4763* (2006.01)

(52) U.S. Cl. .................. 257/758; 257/750; 257/760; 438/622; 438/643; 438/653

(58) Field of Classification Search .......... 438/618, 438/620, 622, 623, 627, 633, 643, 645, 653, 438/687; 257/750, 751, 752, 758, 760
See application file for complete search history.

(56) References Cited

U.S. PATENT DOCUMENTS

| 5,592,024 | A  | * | 1/1997  | Aoyama et al. ............. 257/751 |
| 6,251,786 | B1 |   | 6/2001  | Zhou et al. |
| 6,395,607 | B1 | * | 5/2002  | Chung ........................ 438/312 |
| 6,706,625 | B1 |   | 3/2004  | Sudijono et al. |
| 6,774,057 | B1 | * | 8/2004  | Lu et al. ..................... 438/783 |
| 7,071,564 | B1 | * | 7/2006  | Erb et al. .................... 257/774 |
| 7,087,972 | B1 |   | 8/2006  | Ren et al. |
| 7,190,079 | B2 | * | 3/2007  | Andricacos et al. ......... 257/774 |
| 2002/0074664 | A1 | | 6/2002 | Nogami et al. |
| 2004/0134792 | A1 | | 7/2004 | Butterfield et al. |
| 2004/0175921 | A1 | * | 9/2004 | Cowley et al. ............. 438/622 |
| 2004/0224497 | A1 | | 11/2004 | Barth |
| 2005/0218010 | A1 | | 10/2005 | Wang et al. |
| 2005/0239281 | A1 | * | 10/2005 | Goodner et al. ............ 438/629 |
| 2006/0099807 | A1 | | 5/2006 | Jeong |
| 2006/0199351 | A1 | | 9/2006 | Lee et al. |

* cited by examiner

*Primary Examiner*—Kevin M Picardat
(74) *Attorney, Agent, or Firm*—Slater & Matsil, L.L.P.

(57) ABSTRACT

An integrated circuit interconnect structure includes a conductive line, a first barrier layer disposed on a bottom surface of conductive line, a second barrier layer disposed on the top surface of the conductive line, and an interlevel dielectric surrounding the conductive line.

19 Claims, 7 Drawing Sheets

SEMICONDUCTOR INTERCONNECT AND METHOD OF MAKING SAME

TECHNICAL FIELD

The present invention relates generally to semiconductor devices and methods, and more particularly, to a metal interconnect structure and method.

BACKGROUND

Semiconductors are widely used for integrated circuits for electronic applications, including radios, televisions, and personal computing devices, as examples. Such integrated circuits typically use multiple transistors fabricated in single crystal silicon. It is common for there to be millions of semiconductor devices on a single semiconductor product. To provide the necessary signal and power interconnections for the multiplicity of semiconductor devices, many integrated circuits now include multiple levels of metallization.

The semiconductor industry continuously strives to decrease the size of the semiconductor devices located on integrated circuits. Miniaturization is generally needed to accommodate the increasing density of the circuits necessary for today's advanced semiconductor products. The increasing density has led to the need for more metallic layers, typically of aluminum and more recently of copper, to provide the circuit interconnections. With the increasing number of metallic interconnection layers, more manufacturing steps and cost are required to form the interconnections than the transistors and diodes in the semiconductor device. For high complexity, high density chips with six or more layers of metallization, the total length of the layered interconnect wiring in the chip can be of the order of a mile. The signaling speed among on-chip devices provided by these interconnections has become a significant factor in chip performance. The resistance of the interconnecting wiring generally increases as a consequence of its width-height product being reduced faster than its length is shortened, which further aggravates the signaling-speed problem.

One solution to the problem of line resistance is by using copper interconnects. While copper has the desirable property of low resistivity, it has the problem of being difficult to etch as well as having the propensity of drifting and diffusing into any surrounding interlevel dielectric exposed to the surface of the copper.

To address the issue of copper being difficult to etch, a layered and patterned metal interconnect structure is conventionally formed in the upper layers of an integrated circuit to provide the necessary circuit connections for the various semiconductor devices in the integrated circuit such as transistors and diodes. In high-density integrated circuits, damascene techniques are used to form and deposit metal lines and vias for the desired interconnections in a surrounding dielectric layer.

To address the problem of copper diffusing into the ILD, barrier materials are used to surround the copper to prevent diffusion. Barrier materials can include metallic materials such as TiN or TiW, or dielectric materials such as SiN. One common technique used to encapsulate the top surface of a copper line is to deposit a dielectric layer over the surface of the wafer after each layer of copper interconnect is deposited. This dielectric layer typically has a higher k than the low k ILD. While the dielectric makes a good, non-conductive diffusion barrier, the presence of a global dielectric layer increases the effective k of the solution and increases the capacitive coupling between metallization. What is needed is a method to utilize a low k dielectric ILD without the loss of its low-k properties including k degradation during the etch process or loss of effective k because of the use of a higher k encapsulation layer.

SUMMARY OF THE INVENTION

In one embodiment, an integrated circuit interconnect structure includes a conductive line, a first barrier layer disposed on a bottom surface and sidewalls of conductive line, a second barrier layer produced on the top surface of the conductive line, and an interlevel dielectric surrounding the conductive line.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION

The making and using of the presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

The invention will be described with respect to preferred embodiments in a specific context, namely a BEOL processing of damascene structures. The invention may also be applied, however, to other semiconductor structures.

Figure 1:
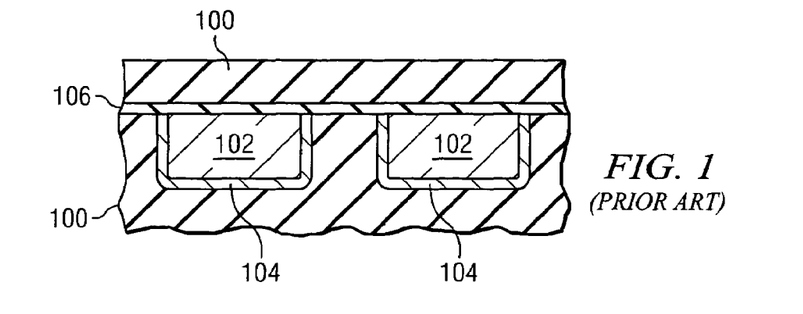
FIG. 1 is a cross sectional view of a conventional parallel copper interconnect structure.

FIG. 1 illustrates a conventional cross section of two parallel copper interconnect lines 102 disposed within a low-k interlevel dielectric (ILD) 100. Copper lines 102 are surrounded by a barrier metal 104 on the bottom and sidewalls, and by a dielectric layer 106 on top to prevent the copper from diffusing into the ILD 100. The ILD can consist of any regular or low-k dielectric. The barrier metal 104 typically consists of TaN/Ta and the dielectric level 106 is typically made of N-BloK (N-rich SiC).

The ILD consists of low-k dielectric material with a k currently in the range of 2.3 and 3.0. In practice, however, the effective k of the dielectric material surrounding the copper lines is higher than the ILD material itself. One reason why the effective k of the dielectric is higher is because of dielectric layer 106 which is typically a high-k dielectric, and because dielectric 106 continues over both copper lines 102, the dielectric layer 106 increases the coupling between the lines and thereby increases the effective k of the dielectric between conductive structures.

Another particular yet non-restrictive reason why the effective k increases is that, if a porous dielectric is used, damage is done to the dielectric during etch that can cause the porous structure to crack or damage. A porous dielectric is similar to a sponge in structure in that the dielectric consists of many holes and non-filled areas. When a porous dielectric is exposed to a reactive ion etch (RIE), the whole structure collapses or is chemically changed and the effective k increases.

FIGS. 2a-2j are cross-sectional drawings of the fabrication of a first embodiment process. In the first embodiment of the present invention the top surface of each copper line is encapsulated by either a local dielectric or a local metal barrier layer rather than a global dielectric layer. Furthermore, a technique is used whereby porous dielectric is formed between copper lines without being degraded by being damaged by exposure to an etching process.

Figure 2A:
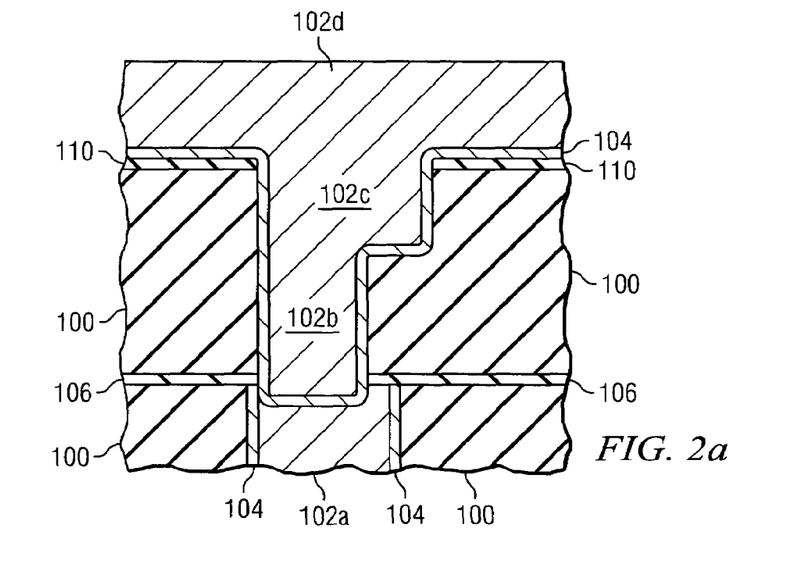
FIGS. 2a-2j contain cross sectional views of the fabrication of first embodiment interconnect structure.

FIG. 2a shows a cross section of a partially fabricated copper interconnect structure. A lower copper interconnect line 102a, is connected to an upper copper interconnect line 102c by a copper filled via 102b using standard damascene techniques. In the first embodiment process, non-porous low-k ILD 100 is typically deposited on a semiconductor body (not shown) and trenches defining the copper lines and vias are etched using a reactive ion etch (RIE). The metal level below 102a is made as in conventional processing.

The etched trenches and vias are lined with a barrier layer 104, for example using a physical vapor deposit (PVD). The copper line 102a is encapsulated by barrier layer 104 and by a dielectric layer 106 to prevent the copper from diffusing into the ILD 100. At the point of the process shown in FIG. 2a, a hard mask 110, usually formed from an oxide or a nitride, can remain, but does not necessarily remain over the conductive liner 104.

The barrier layer 104, typically formed from TaN/Ta serves a dual purpose. First it forms a barrier that prevents the copper from diffusing into the ILD. And second, it forms a conductive surface on which copper is electroplated, e.g., using a wet deposition in a plating chamber. A voltage is typically applied to the wafer while immersed in a copper sulfide solution. If the voltage applied to the wafer is a negative voltage, then copper is deposited on the wafer. If the voltage applied to the wafer is positive, however, copper is removed. Copper region 102d is the residual copper present on the wafer that needs to be removed so that the copper line 102c does not short out other copper lines in the same layer.

Figure 2B:
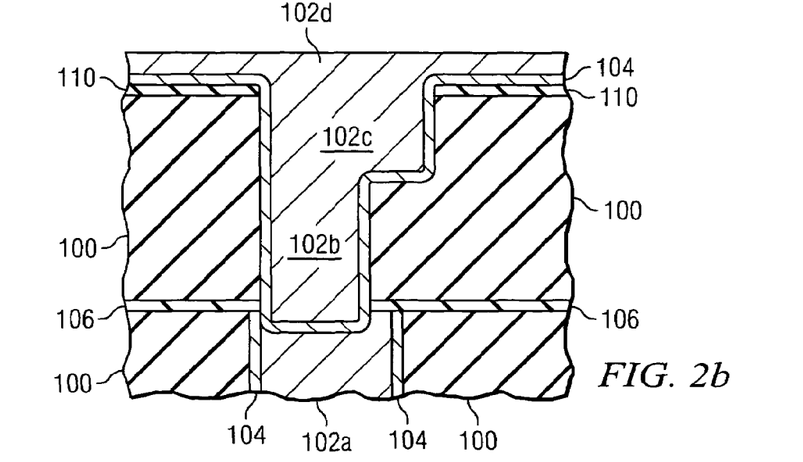

Turning to FIG. 2b, in the first embodiment, the residual copper layer 102d is removed using electrochemical Mechanical Planarization (E-CMP). In E-CMP, first an oxidizing liquid is deposited on the surface of the conductive surface. The surface of the material 102d to be planarized is then exposed to a mechanical polisher and a positive voltage. Surface conductive material is then removed both mechanically but mainly electrically by reverse electro-plating. The non-conductive material present in the topological recesses ensure that the lower topological surfaces are not reverse-electroplated, while the higher topological surfaces are both mechanically polished and reverse electroplated. The end result of the E-CMP process step is the rapid formation of a planar surface, with a thin layer of Cu 102d remaining as shown in FIG. 2b.

Figure 2C:
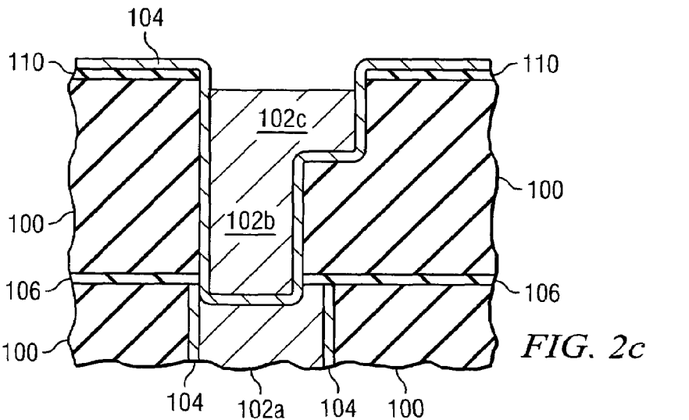

As shown in FIG. 2c, the thin remaining 102d and a portion of the copper interconnect 102c is removed to a depth below the hard mask 110. Removing the copper below the barrier layer 104 uses a specialized conductive E-CMP pad such as a conductive contact pad manufactured by Applied Materials in order to remove the copper to a depth below the top of the trench. Prior generations of E-CMP equipment could not remove material below a surface because there was no way to provide a positive voltage to the below the surface area to facilitate the reverse plating process. Here the positive voltage can be applied with touching of the conductive pad and the metal barrier 104 to conduct the voltage to the below surface copper 102c and the reverse plating can be extended below surface. Newer generations of E-CMP equipment such as the Applied Materials pad are able to keep a voltage supplied to the area to be processed by utilizing conductive materials in polishing pads to make electrical contact with the surface of the metal barrier 104.

Figure 2D:
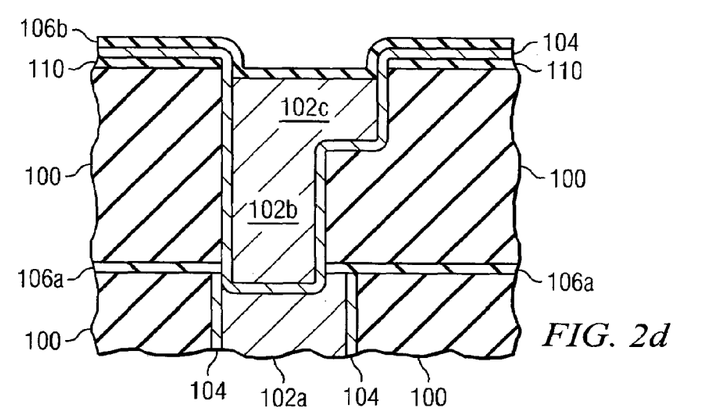

According to FIG. 2d, a dielectric layer 106b is deposited on the surface of the exposed barrier layer 104 and onto the copper within the recess formed by the previous E-CMP step. In the first embodiment of the present invention, dielectric layer 106b is preferably SiN or N-BloK, but in alternate embodiments of the present invention, layer 106b can be other dielectrics or even conductive materials such as TaN/Ta. Alternatively, this dielectric layer may comprise any material that serves two purposes: First, it is a copper diffusion barrier, and second, it enables a selective RIE to etch the ILD 100.

Figure 2E:
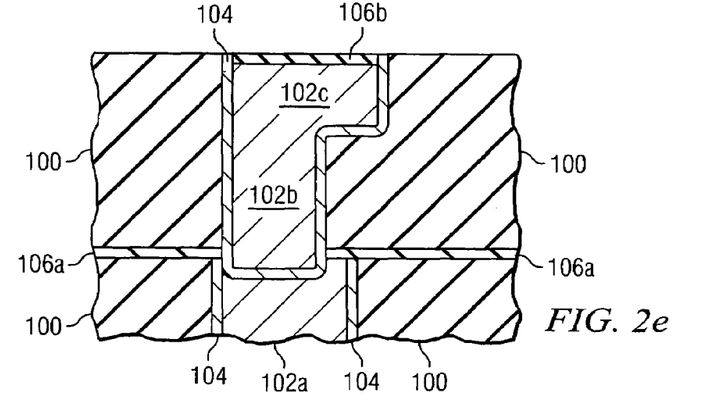

FIG. 2e shows the interconnect after the surface has been removed past the hard mask 110 but allowing the portion of the dielectric/barrier region 106b over the copper region 102c to remain. This step is preferably accomplished by a mechanical, non-selective CMP.

Figure 2F:
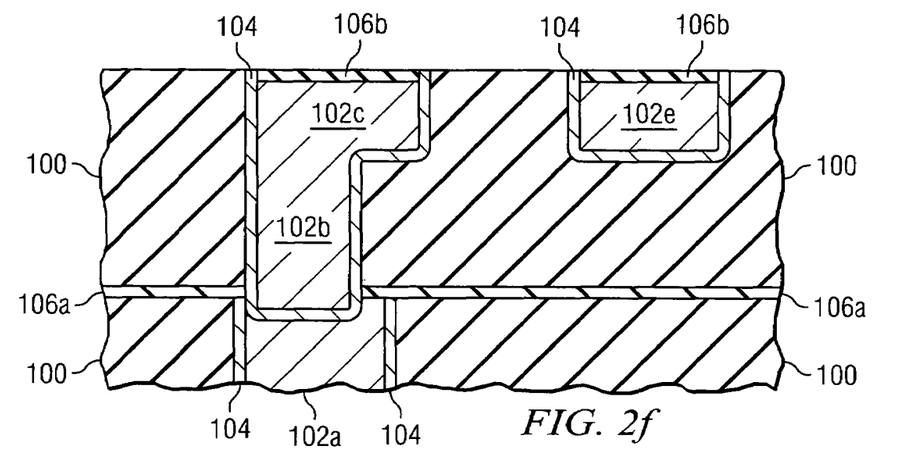

A wider cross section of the interconnect structure shown in FIG. 2f illustrates a copper interconnect 102e alongside copper line 102c. As result of this invention, layer 106b does not extend between two Cu lines, as in conventional regime 106a. Consequently, 106b can be a dielectric later, or a conductive material such as Ta/TaN. In two alternate embodiments of the present invention, the effective k value of the dielectric layer could be further reduced using techniques described herein.

Figure 2G:
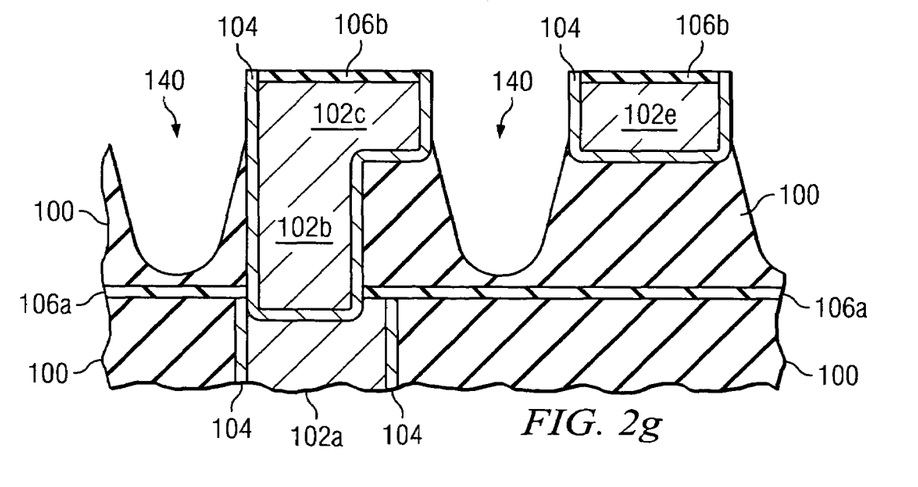

In FIG. 2g, regions of the low-k non-porous dielectric are etched away between lines using, for example, a well-established technique of an RIE selective between 106b and 100, forming recesses 140. In two alternate embodiments of the present invention, however, more or less dielectric material may be removed and refilled thereafter.

Figure 2H:
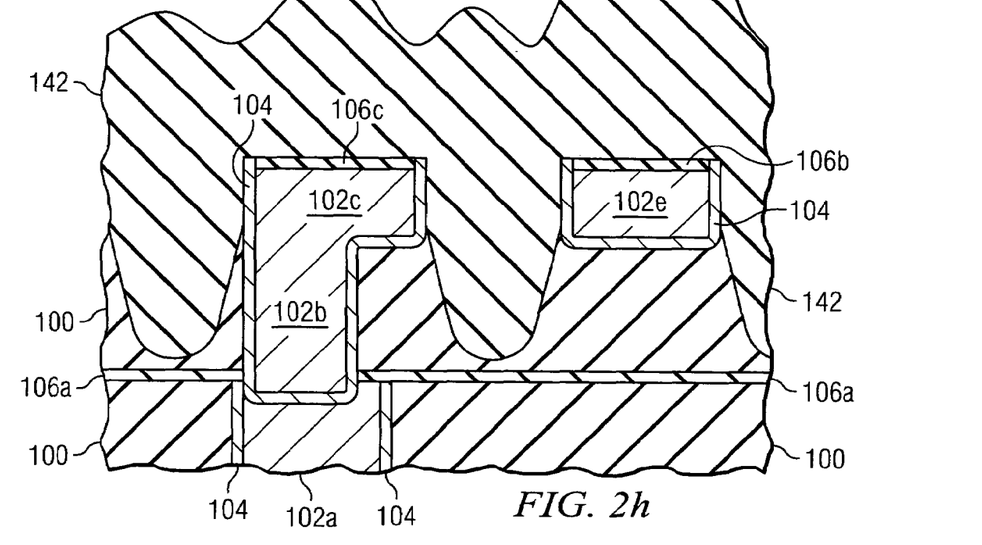
Figure 2I:
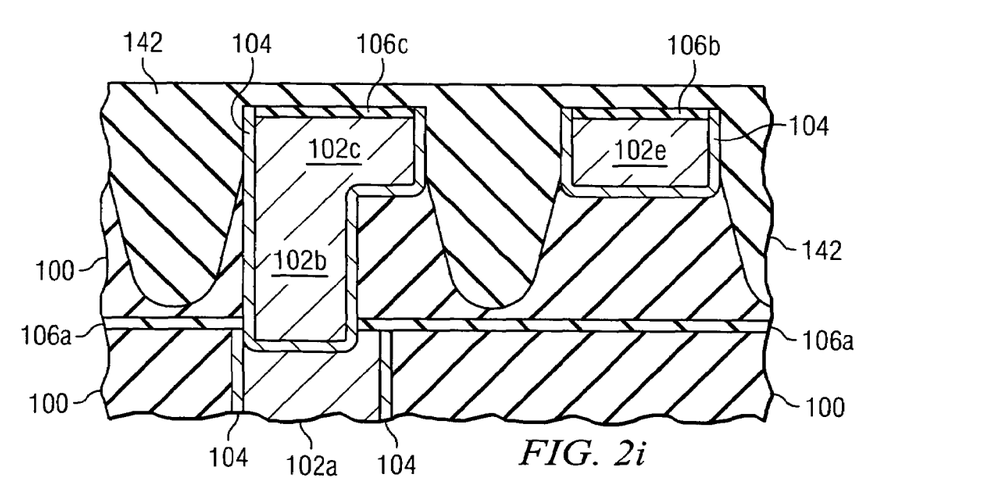
Figure 2J:
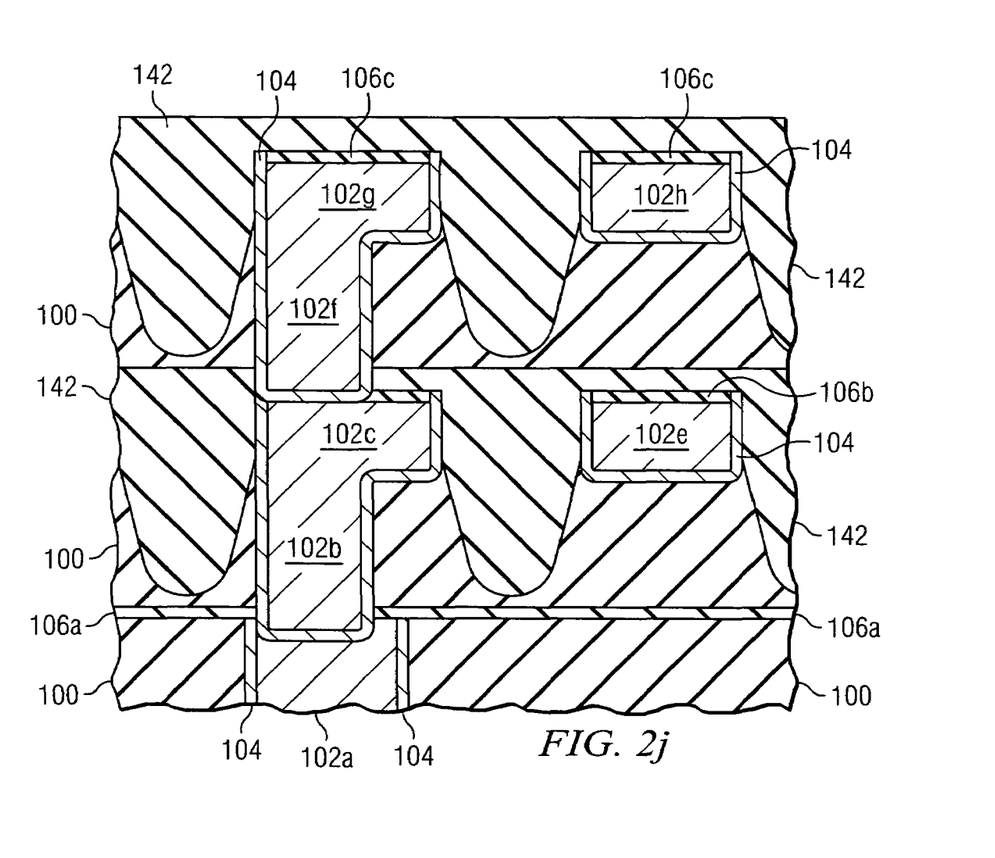

Turning to FIG. 2h, a porous low-k dielectric 142 is deposited to refill recesses 140 and on the surface of the interconnect structures. In the some embodiments of the present invention, a porous low-k is formed using CVD and respectively treated post deposition (e.g. UV anneal) After the porous low-k dielectric is deposited, a time-controlled CMP is used to planarize the surface as shown in FIG. 2i. This process may be repeated for one or more additional metallization layers as shown in FIG. 2j.

Figure 3A:
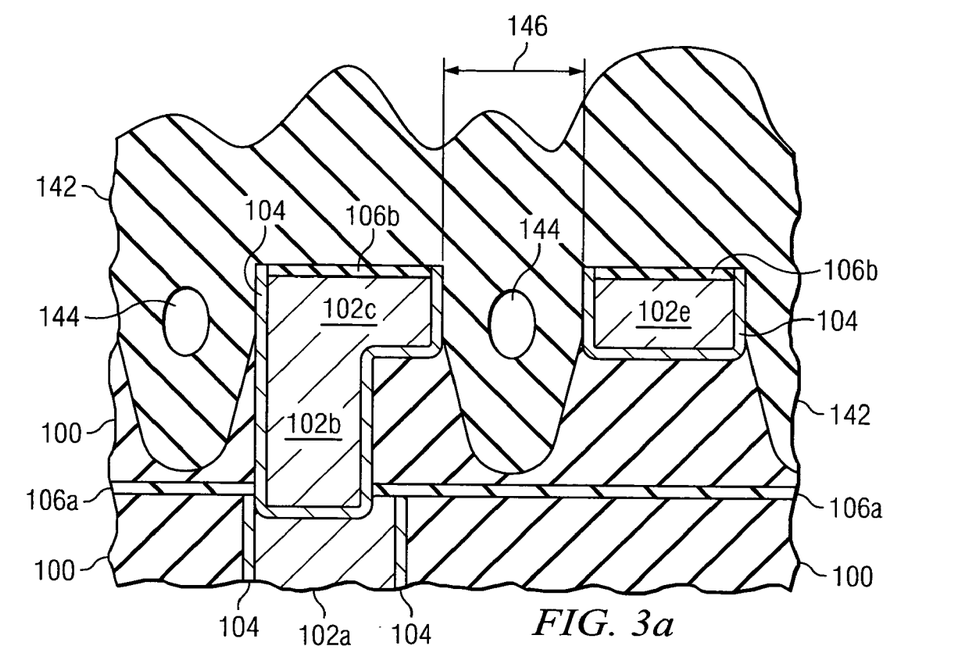
FIGS. 3a-3c contain cross sectional views of a second embodiment interconnect structure.
Figure 3B:
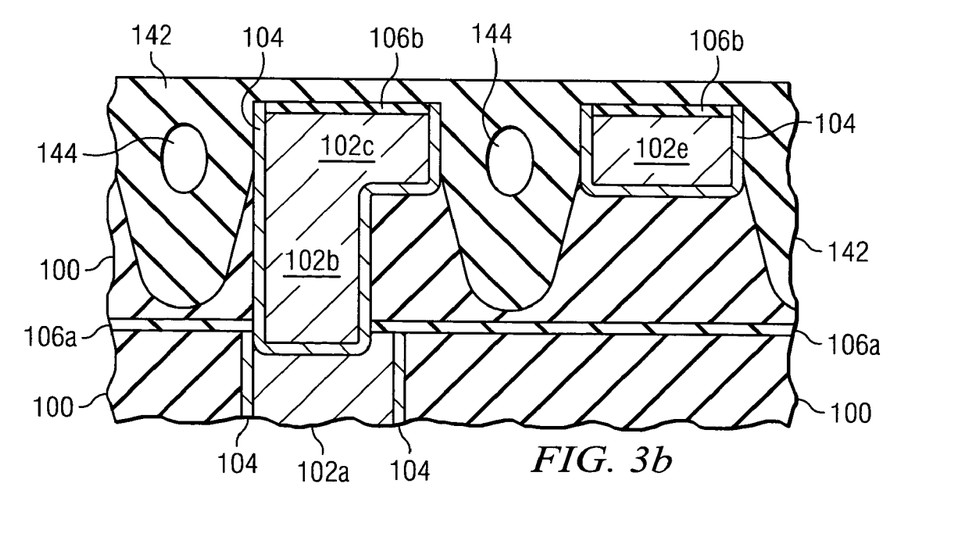
Figure 3C:
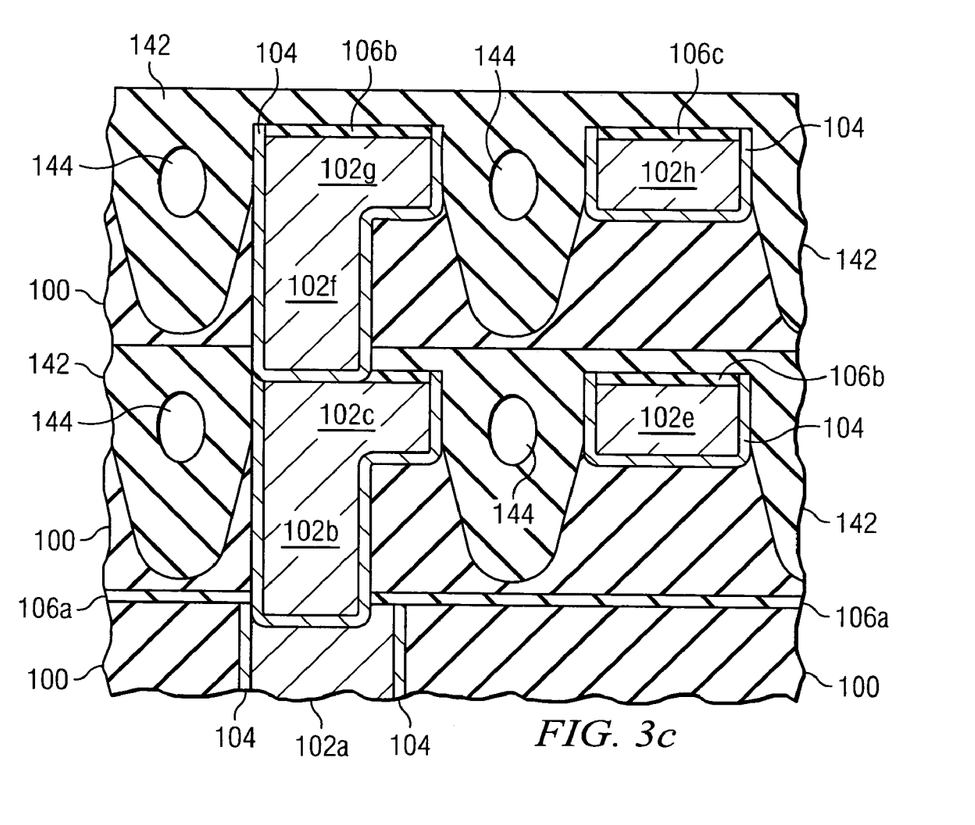

Cross sectional diagrams showing formation of an alternative embodiment of the present invention are shown in FIGS. 3a-3c. Processing in the second embodiment of the present invention is similar to the first alternative embodiment. In this embodiment, there is a dimensional restriction 146 on the minimum dimension between interconnects as seen in FIG. 3a. Tweaking the process conditions of CVD 142 will form air gaps 144, which further lowers the effective k of the ILD. This ILD 144 can be dense or porous low-k dielectric, depending on the particular performance requirements.

Processing continues in the second embodiment of the second invention as shown in FIG. 3b where the surface of the porous low-k ILD is planarized using CMP. Additional layers of metallization using the techniques described herein can also be fabricated as shown in FIG. 3c and as described herein above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit interconnect structure comprising:
   a first conductive line;
   a first barrier layer disposed at a bottom surface and on sidewall surfaces of the first conductive line;
   a second barrier layer disposed on a top surface of the first conductive line; and
   an interlevel dielectric surrounding the first conductive line, and first and second barrier layers, wherein the interlevel dielectric comprises
      a non-porous low-k dielectric beneath the bottom surface of the first conductive line, and
      a porous low-k dielectric adjacent to the sidewall surfaces of the first conductive line, the porous low-k dielectric comprising air gaps.

2. The integrated circuit interconnect structure of claim 1, wherein the interlevel dielectric comprises a non-porous low-k dielectric.

3. The integrated circuit interconnect structure of claim 1, further comprising:
   a second conductive line laterally spaced from the first conductive line;
   the first barrier layer disposed on a bottom surface and on sidewall surfaces of the second conductive line;
   the second barrier disposed on a top surface of the second conductive line;
   a non-porous low-k dielectric beneath the bottom surface of the second conductive line;
   wherein the porous low-k dielectric is disposed adjacent the sidewall surface of the second conductive line and extends between the first conductive line and the second conductive line.

4. The integrated circuit interconnect structure of claim 3, wherein the porous low-k dielectric includes airgaps between the first conductive line and the second conductive line.

5. The integrated circuit interconnect structure of claim 1, wherein the first conductive line comprises copper.

6. The integrated circuit interconnect structure of claim 5, wherein the first barrier layer comprises a conductive layer.

7. The integrated circuit interconnect structure of claim 6, wherein the second barrier layer comprises an insulating layer.

8. The integrated circuit interconnect structure of claim 6, wherein the second barrier layer comprises a conductive layer.

9. A method of forming an integrated circuit interconnect structure, the method comprising:
   forming a first recess and a second recess in an interlevel dielectric layer, the interlevel dielectric comprising a non-porous dielectric;
   depositing a first barrier layer in the first recess, the second recess, and on a surface of the interlevel dielectric;
   depositing a conductive material on a surface of the first barrier layer to fill the first recess and the second recess;
   removing a portion of the conductive material using an electro-chemical mechanical polishing process, wherein the surface of the first barrier layer outside of the first recess and the second recess is exposed and a portion of the conductive material within the first recess and the second recess is removed below the surface of the interlevel dielectric layer;
   depositing a second barrier layer over a surface of the conductive material in the first recess, the second recess, and the exposed first barrier layer; and
   performing a planarization step to remove the first barrier layer and the second barrier layer from the surface of the interlayer dielectric such that an upper surface of the second barrier layer is substantially flush with the surface of the interlayer dielectric, the conductive material surrounded by the first and second barrier layers thereby forming a first conductive interconnect and a second conductive interconnect;
   forming a trench in the non-porous interlevel dielectric between the first conductive interconnect and the second conductive interconnect; and
   forming a porous interlevel dielectric in the trench between the first conductive interconnect and the second conductive interconnect and over the first conductive interconnect and second conductive interconnect.

10. The method of claim 9, the method further comprising planarizing a top surface of the porous interlevel dielectric.

11. The method of claim 10, wherein the first conductive interconnect and the second conductive interconnect are spaced at a distance wherein air gaps form in the porous interlevel dielectric.

12. The method of claim 9, wherein the first barrier layer comprises a conductive material and the second barrier layer comprises a non-conductive material.

13. The method of claim 9, wherein the first barrier layer comprises a conductive material and the second barrier layer comprises a conductive material.

14. A semiconductor device comprising:
   a semiconductor body;
   a first interlevel dielectric disposed over the semiconductor body; and
   a first metallization layer comprising
      a first copper interconnect line,
      a second copper interconnect line,
      a first barrier layer disposed at a bottom surface and on sidewall surfaces of the first copper interconnect line and the second copper interconnect line, and
      a second barrier layer disposed at a top surface of the first copper interconnect line; and
   a second interlevel dielectric surrounding the first copper interconnect line, and first and second barrier layers, wherein
      the second interlevel dielectric comprises a non-porous dielectric beneath the bottom surface of the first and second copper interconnect lines and a porous dielectric adjacent the sidewall surfaces of the first and second copper interconnect lines, and the second interlevel dielectric comprises air gaps between the first copper interconnect line and the second copper interconnect line.

15. The semiconductor device of claim 14, further comprising a second metallization layer disposed over the first metallization layer, the second metallization layer comprising:
   a third copper interconnect line,
   a fourth copper interconnect line,
      a third barrier layer disposed on a bottom surface and on sidewall surfaces of the third copper interconnect line and the fourth copper interconnect line,
   a fourth barrier layer disposed on a top surface of the third conductive interconnect line and the fourth copper interconnect line, and
   a third interlevel dielectric surrounding the third copper interconnect line, and third and fourth barrier layers, wherein
      the third interlevel dielectric comprises a non-porous dielectric beneath the bottom surface of the third and fourth interconnect lines and a porous dielectric adjacent the sidewall surfaces of the third and fourth copper interconnect lines, and
      the third interlevel dielectric comprises air gaps between the second copper interconnect line and the fourth copper interconnect line.

16. The semiconductor device of claim 15, further comprising copper connecting a copper line from the first metallization layer to the second metallization layer.

17. The integrated circuit interconnect structure of claim 1, wherein the porous low-k dielectric comprises the at least one air gap.

18. A method of forming an integrated circuit interconnect structure, the method comprising:
   forming a first recess in an interlevel dielectric layer, the interlevel dielectric layer comprising a non-porous dielectric;
   depositing a first barrier layer in the first recess and on a surface of the interlevel dielectric;
   depositing a conductive material on a surface of the first barrier layer to fill the first recess;
   removing a portion of the conductive material using an electro-chemical mechanical polishing process, wherein the surface of the first barrier layer outside of the first recess is exposed and a portion of the conductive material within the first recess is removed below the surface of the interlevel dielectric layer;
   depositing a second barrier layer over a surface of the conductive material and the exposed first barrier layer; and
   performing a planarization step to remove the first barrier layer and the second barrier layer from the surface of the interlayer dielectric such that an upper surface of the second barrier layer is substantially flush with the surface of the interlayer dielectric, the conductive material surrounded by the first and second barrier layers thereby forming a first conductive interconnect;
   forming a trench in the non-porous interlevel dielectric adjacent to the first conductive interconnect; and
   forming a porous interlevel dielectric in the trench adjacent to the first conductive interconnect and over the first conductive interconnect.

19. The method of claim 18, wherein the porous interlevel dielectric in the trench adjacent to the first conductive interconnect comprises airgaps.

* * * * *